United States Patent [19]
Yamamoto

[11] Patent Number: 6,008,702
[45] Date of Patent: Dec. 28, 1999

[54] VOLTAGE-CONTROLLED OSCILLATOR WITH DIODE AND PASSIVE ELEMENT TO INCREASE RANGE OF OSCILLATING FREQUENCY

[75] Inventor: Hiroyuki Yamamoto, Shiga-ken, Japan

[73] Assignee: Murata Manufacturing Co., Ltd., Nagaokakyo, Japan

[21] Appl. No.: 09/045,956

[22] Filed: Mar. 23, 1998

[30]     Foreign Application Priority Data

Mar. 27, 1997  [JP]  Japan ................................. 9-075962

[51] Int. Cl.$^6$ ................................. H03B 5/12; H03B 5/18
[52] U.S. Cl. ................... 331/179; 331/36 C; 331/117 R; 331/117 D; 331/177 V
[58] Field of Search ............................ 331/36 C, 116 R, 331/116 FE, 117 R, 117 FE, 117 D, 179, 177 V

[56]     References Cited

U.S. PATENT DOCUMENTS

| | | |
|---|---|---|
| 4,593,257 | 6/1986 | Wignot . |
| 4,598,423 | 7/1986 | Hettiger ............................. 331/179 X |
| 5,187,451 | 2/1993 | Nakamoto et al. . |

OTHER PUBLICATIONS

Patent Abstracts of Japan, vol. 006, No. 170, E–128, Sep. 3, 1982, JP 57–087207.
Patent Abstracts of Japan, vol. 014, No. 051, E–0881, Jan. 30, 1990, JP 01–276904.
Patent Abstracts of Japan, vol. 010, No. 079, E–391, Mar. 28, 1986, JP 60–224308.

*Primary Examiner*—David Mis
*Attorney, Agent, or Firm*—Burns, Doane, Swecker & Mathis, LLP

[57]     ABSTRACT

A Colpitts-type voltage-controlled oscillator includes a transistor having a collector which is connected to a power terminal through a stripline. A capacitor is connected between the collector and the emitter thereof. A diode is connected to the capacitor and an inductor is connected to a point between the capacitor and diode. Another capacitor is connected between the base and the emitter of the transistor. An inductive reactance is formed by a stripline which is connected between the base of the transistor and the ground, two capacitors for DC blocking, and a variable-capacitance diode. Bypass capacitors are connected between the collector of the transistor and the ground. A resistor is connected between the emitter of the transistor and the ground. Two other resistors are provided for dividing a power voltage at the power terminal and for supplying a base voltage to the transistor. Turning the diode on and off allows the oscillating frequency of the voltage-controlled oscillator to vary by a large amount.

12 Claims, 1 Drawing Sheet

VOLTAGE-CONTROLLED OSCILLATOR WITH DIODE AND PASSIVE ELEMENT TO INCREASE RANGE OF OSCILLATING FREQUENCY

This application is based on Japanese Patent Application No. 9-75962 filed on Mar. 27, 1997, which is incorporated in its entirety herein by reference.

BACKGROUND OF THE INVENTION

1. Field of the Invention

The present invention relates to voltage-controlled oscillators, and more particularly, to voltage-controlled oscillators having an added function for switching the oscillating frequency. The voltage-controlled oscillators find exemplary use in high-frequency circuits, such as dual-mode portable telephones.

2. Description of the Related Art

FIG. 2 is a circuit diagram of a conventional voltage-controlled oscillator. The voltage-controlled oscillator 1 is a Colpitts-type oscillating circuit including a transistor Q1. The collector of the transistor Q1 is connected to a power terminal 2 through a stripline L1, which acts as a choke. A capacitor C1 is connected between the collector and the emitter of the transistor Q1, while a capacitor C2 is connected between the base and the emitter of the transistor Q1. An inductive reactance is formed of a stripline L2 connected between the base of the transistor Q1 and the ground, capacitors C3 and C4 which are used for DC blocking, and a variable-capacitance diode VD1. Bypass capacitors C5 and C6 are connected between the collector of the transistor Q1 and the ground. A resistor R1 is connected between the emitter of the transistor Q1 and the ground, while resistors R2 and R3 are provided for dividing a power voltage Vb at the power terminal 2 and for supplying a base voltage to the transistor Q1.

The voltage-controlled oscillator 1 oscillates only when Z1+Z2+Z3=0. In this expression, Z1 indicates the inductive reactance between the collector and the base of the transistor Q1, Z2 indicates the reactance between the base and the emitter of the transistor Q1, and Z3 indicates the reactance between the collector and the emitter of the transistor Q1. Note that this description of the circuit takes account for the "effective" operational interrelationship of components. For instance, Z1 is shown as located between the base of the transistor Q1 and the terminal 3. However, since the transistor Q1 is collector grounded by C6 in the oscillating frequency, Z1 may be regarded as located between the collector and the base of the transistor Q1.

A control voltage Vc is input to an input terminal 3. As this control voltage Vc changes, the capacitance of the variable-capacitance diode VD1 changes accordingly. Since the inductive reactance Z1 changes, the oscillating frequency $f_{osc}$ of the voltage-controlled oscillator 1 changes. Therefore, the oscillating frequency $f_{osc}$ of the voltage-controlled oscillator 1 can be changed by changing the control voltage Vc.

Since the oscillation condition is strictly determined by the relationship Z1+Z2+Z3=0, the range in which the oscillating frequency $f_{osc}$ changes is somewhat restricted. In other words, the oscillating frequency cannot be extended by a large amount by only changing the inductive reactance Z1 between the collector and the base of the transistor Q1.

SUMMARY OF THE INVENTION

Accordingly, it is an object of the present invention to provide a voltage-controlled oscillator in which the range where the oscillating frequency can be switched is increased.

The foregoing object of the present invention is achieved through the provision of a voltage-controlled oscillator in which an inductive reactance is connected between the collector and the base of a transistor. A first capacitor is connected between emitter and the collector of the transistor, and a second capacitor is connected between the base and the emitter of the transistor, thereby forming a Colpitts-type oscillating circuit. A diode is provided between the collector of the transistor and the first capacitor, wherein the first capacitor is connected between the emitter and the collector. One end of a passive element is connected to a connection point between the diode and the first capacitor, which is connected between the emitter and the collector.

In the above-described voltage-controlled oscillator, since the diode is provided between the collector of the transistor and the first capacitor (which is connected between the emitter and the collector of the transistor), the reactance Z3 between the collector and the emitter of the transistor can be changed by turning the diode on and off. Accordingly, the oscillating frequency $f_{osc}$ of the voltage-controlled oscillator can be switched by a large amount from the oscillating frequency which satisfies Z1+Z2+Z3=0, to the oscillating frequency which satisfies Z1+Z2=0. In other words, the range in which the oscillating frequency is switched can be extended.

An inductor may serve as the passive element in the voltage-controlled oscillator.

In the above-described voltage-controlled oscillator, since one end of the inductor is connected to the connection point between the capacitor and the diode between the collector and the emitter of the transistor, the diode and the inductor form a parallel resonant circuit. Therefore, the resonant frequency of the parallel resonant circuit formed of the capacitor and the inductor, namely the oscillating frequency which satisfies Z1+Z2=0, is set to the desired value by changing the inductor.

BRIEF DESCRIPTION OF THE DRAWINGS

These and other objects, features and advantages of the invention will be apparent from the following more particular description of preferred embodiments of the invention, as illustrated in the accompanying drawings, wherein.

DESCRIPTION OF THE PREFERRED EMBODIMENT

Figure 1:
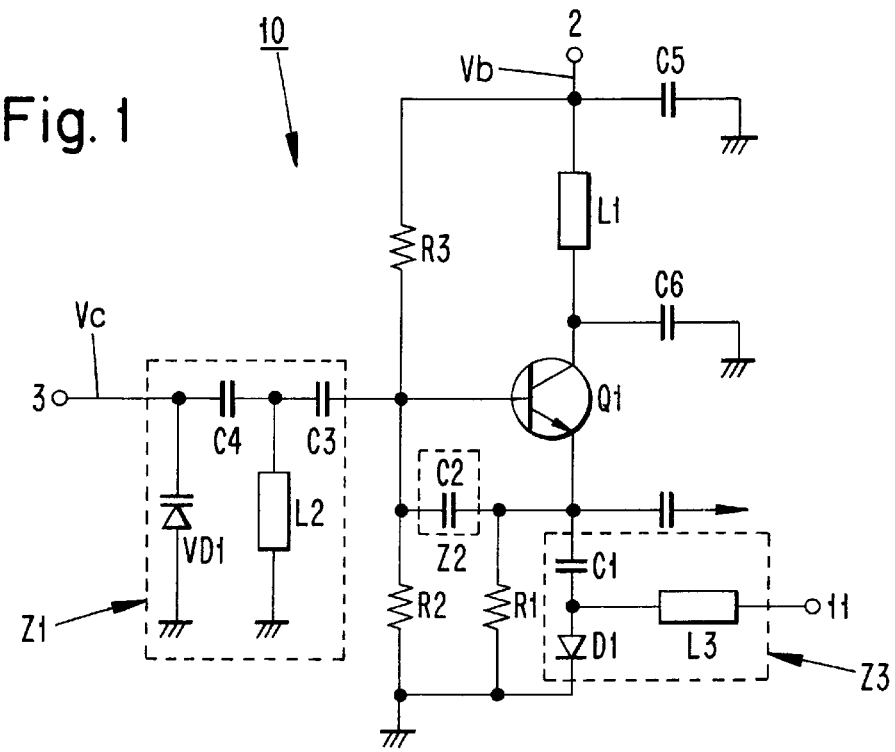
FIG. 1 is a circuit diagram of a voltage-controlled oscillator according to an exemplary embodiment of the present invention.
Figure 2:
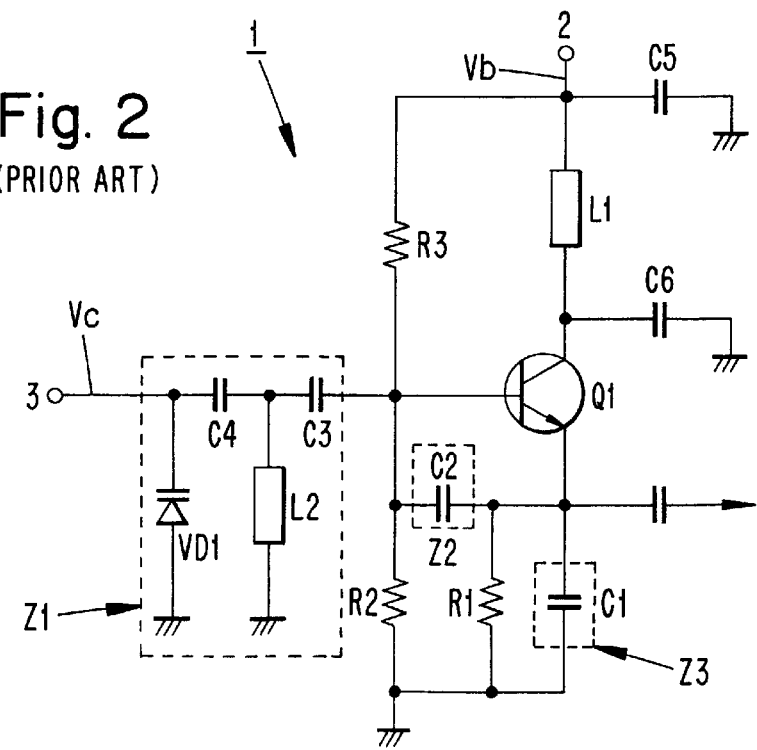
FIG. 2 is a circuit diagram of a conventional voltage-controlled oscillator.

FIG. 1 is a circuit diagram of a voltage-controlled oscillator 10 according to an exemplary embodiment of the present invention. The voltage-controlled oscillator 10 includes a diode D1 connected between the collector of the transistor Q1 and a capacitor C1. The capacitor C1 is connected between the emitter and the collector of the transistor Q1. One end of a inductor L3 is connected to a connection point between the capacitor C1 and the diode D1, and the other end of the inductor L3 is connected to a control terminal 11. The control terminal 11 is used for controlling the turning on and off of the diode D1. Those features which are common to both FIGS. 1 and 2 are labeled with like reference numerals, and a description thereof is omitted.

The voltage-controlled oscillator 10 shown in FIG. 1 operates in the following way. When the diode D1 is on, the diode D1 is in a closed state and only the capacitor C1 forms the capacitance between the collector and the emitter of the transistor Q1. Therefore, the oscillating frequency $f_{osc}$ of the voltage-controlled oscillator 10 becomes an oscillating frequency $f_1$ which satisfies the relationship Z1+Z2+Z3=0 when the diode D1 is on.

When the diode D1 is off, the diode D1 serves as a capacitor and forms a parallel resonant circuit with the inductor L3. The reactance Z3 between the collector and the emitter of the transistor Q1 is minute, comprising just the internal capacitance of the transistor Q1. In other words, the reactance Z3≅0 at the resonant frequency $f_2$ of the parallel resonant circuit. Therefore, the oscillating frequency $f_{osc}$ of the voltage-controlled oscillator 10 becomes an oscillating frequency which satisfies the relationship Z1+Z2=0, namely the resonant frequency $f_2$ of the parallel resonant circuit, when the diode D1 is off.

As described above, in the foregoing embodiment, since the diode D1 is provided between the collector of the transistor Q1 and the capacitor C1, and the capacitor C1 is connected between the emitter and the collector of the transistor Q1, the reactance Z3 between the collector and the emitter of the transistor Q1 can be changed by turning the diode D1 on and off. Accordingly, the oscillating frequency $f_{osc}$ of the voltage-controlled oscillator 10 can be switched by a large amount from the oscillating frequency which satisfies Z1+Z2+Z3=0, namely f1, to the oscillating frequency which satisfies Z1+Z2 =0, namely $f_2$.

For example, in a typical voltage-controlled oscillator 1 as shown in FIG. 1, the oscillating frequency can be switched between 800 MHz and 1.3 GHz (about a 500 MHz change) by switching the control voltage Vc. In contrast, in the voltage-controlled oscillator 10 of the present embodiment, the oscillating frequency can be switched between the exemplary range of 650 MHz and 1.7 GHz (about a 1 GHz change) by turning the diode D1 on and off.

Since one end of the inductor L3 is connected to the connection point between the capacitor C1 and the diode D1 between the collector and the emitter of the transistor Q1, the diode D1 and the inductor L3 form a parallel resonant circuit. Therefore, the resonant frequency $f_2$ of the parallel resonant circuit formed by the capacitor C1 and the inductor L3, namely the oscillating frequency which satisfies Z1+Z2=0, is set to the desired value by changing the inductor L3.

Although the invention has been disclosed and illustrated with reference to a particular embodiment, the principles involved can be used in numerous other embodiments which will be apparent to persons skilled in the art. The invention is, therefore, to be limited only as indicated by the scope of the appended claims.

What is claimed is:

1. A voltage-controlled oscillator, comprising:
   an inductive reactance connected between the collector and the base of a transistor, a first capacitor connected between the emitter and collector of the transistor, and a second capacitor connected between the base and the emitter of the transistor, thereby forming a Colpitts-type oscillating circuit;
   a diode connected between the collector of the transistor and the first capacitor,
   an inductor, one end of the inductor being connected to a connection point between the diode and the first capacitor and the other end of the inductor being connected to a control terminal for controlling the turning on and off of the diode,
   wherein when the diode is off, the diode serves as a capacitor and forms a parallel resonant circuit with the inductor and the parallel resonant circuit affects the oscillating frequency of the voltage-controlled oscillator.

2. The voltage-controlled oscillator according to claim 1, further including a power terminal which is connected to the collector of the transistor through a stripline.

3. The voltage-controlled oscillator according to claim 1, further including at least one bypass capacitor connected between the collector of the transistor and ground.

4. The voltage-controlled oscillator according to claim 1, further including a resistor connected between the emitter of the transistor and the ground.

5. The voltage-controlled oscillator according to claim 1, further including a first resistor connected between a power supply terminal and the base of the transistor, and a second resistor connected between the base of the transistor and ground.

6. The voltage-controlled oscillator according to claim 1, wherein the inductive reactance comprises a stripline connected between the base of the transistor and ground, a third and a fourth capacitors for DC blocking, and a variable-capacitance diode.

7. The voltage controlled oscillator according to claim 6, further including an input terminal for supplying a control voltage to change the inductive reactance of the Colpitts-type oscillating circuit.

8. A voltage-controlled oscillator, comprising:
   an inductive reactance Z1 connected between the collector and the base of a transistor, a reactance Z2 connected between the base and the emitter of the transistor, and a reactance Z3 connected between the collector and the emitter of the transistor, thereby forming a Colpitts-type oscillating circuit,
   a switching element operatively associated with the reactance Z3;
   wherein when the switching element is on, the oscillating frequency of the voltage-controlled oscillator becomes a frequency which satisfies the relationship Z1+Z2+Z3=0; and
   wherein when the switching element is off, the oscillating frequency of the voltage-controlled oscillator becomes a frequency which satisfies the relationship Z1+Z2=0.

9. The voltage-controlled oscillator according to claim 8, wherein the switching element comprises a diode.

10. A voltage-controlled oscillator, comprising:
    Colpitts-type oscillating circuit including
      a transistor having a first current electrode, a second current electrode and a current control electrode, wherein said first current electrode is connected to ground through at least one capacitor, said second current electrode is connected to ground, and said current control electrode is connected to ground,
      an inductive reactance connected between the current control electrode of said transistor and an input terminal,
      a first capacitor connected to the second current electrode of the transistor, and
      a second capacitor connected between the current control electrode and the second current electrode of the transistor;
    a diode connected between the first capacitor and ground; and
    an inductor, one end of the inductor being connected to a connection point between the diode and the first capacitor and the other end of the inductor being connected to a control terminal for controlling the turning on and off of the diode, wherein when the diode is off, the diode serves as a capacitor and forms a parallel resonant circuit with the inductor and the parallel resonant circuit affects the oscillating frequency of the voltage-controlled oscillator.

11. The voltage-controlled oscillator according to claim 10, wherein the inductive reactance comprises a stripline connected between the current control electrode of the transistor and ground, a third and a fourth capacitors for DC blocking, and a variable-capacitance diode.

12. The voltage controlled oscillator according to claim 10, wherein said input terminal for supplying a control voltage to change the inductive reactance of the Colpitts-type oscillating circuit.

* * * * *